(12) United States Patent
Kim et al.

(10) Patent No.: US 10,163,936 B2
(45) Date of Patent: Dec. 25, 2018

(54) DISPLAY DEVICE

(71) Applicant: Samsung Display Co., Ltd., Yongin, Gyeonggi-Do (KR)

(72) Inventors: Il Gon Kim, Seoul (KR); Sun Hwa Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 89 days.

(21) Appl. No.: 14/615,722

(22) Filed: Feb. 6, 2015

(65) Prior Publication Data

US 2016/0035294 A1    Feb. 4, 2016

(30) Foreign Application Priority Data

Aug. 1, 2014    (KR) .................. 10-2014-0099175

(51) Int. Cl.
*G09G 3/36* (2006.01)
*H01L 27/12* (2006.01)
(Continued)

(52) U.S. Cl.
CPC ...... *H01L 27/124* (2013.01); *G02F 1/134309* (2013.01); *G02F 1/136286* (2013.01);
(Continued)

(58) Field of Classification Search
None
See application file for complete search history.

(56) References Cited

U.S. PATENT DOCUMENTS 7,295,275 B2 *  11/2007  Ko ................. G02F 1/134363
                                                         349/141
2004/0238823 A1 * 12/2004  Lee ................. G02F 1/133707
                                                         257/72
(Continued)

FOREIGN PATENT DOCUMENTS

KR    1020130071928        7/2013
KR    10-2013-0110336      10/2013
KR    1020080088737        5/2014

*Primary Examiner* — Christopher R Lamb
(74) *Attorney, Agent, or Firm* — H.C. Park & Associates, PLC

(57) ABSTRACT

A display device includes a first substrate; a plurality of gate lines arranged in a row direction on the first substrate; a plurality of data lines arranged in a column direction intersecting the row direction; and a plurality of pixels formed in a plurality of pixel areas defined by the gate and data lines, the plurality of pixels comprising at least a first pixel and a second pixel repectively disposed in a first pixel area and a second pixel area that are immediately adjacent to each other. Each of the first and second pixels comprises a thin film transistor electrically connected to the gate and data lines, and a pixel electrode electrically connected to the thin film transistor. The data lines are disposed-apart by different distances from each other in the column direction. Each of the first and second pixel areas comprises a first edge portion adjacent to one of the gate lines and a second edge portion adjacent to another of the gate lines, a lengh of the first edge portion being greater than a lengh of the second edge portion. The thin film transistor is disposed at the first edge portion of the first and second pixel areas.

13 Claims, 6 Drawing Sheets

(51) Int. Cl.
  *G02F 1/1343* (2006.01)
  *G02F 1/1362* (2006.01)
  *H01L 27/32* (2006.01)

(52) U.S. Cl.
  CPC .......... *G02F 2001/134372* (2013.01); *G02F 2201/40* (2013.01); *H01L 27/326* (2013.01); *H01L 27/3262* (2013.01)

(56) References Cited

U.S. PATENT DOCUMENTS

| | | | |
|---|---|---|---|
| 2005/0099378 A1* | 5/2005 | Kim ................. | G02F 1/134309 345/99 |
| 2007/0096100 A1* | 5/2007 | Lee ..................... | H01L 29/04 257/59 |
| 2009/0096943 A1* | 4/2009 | Uehara ............. | G02B 27/2214 349/37 |
| 2012/0249943 A1* | 10/2012 | Pai ..................... | G09G 3/3614 349/141 |
| 2013/0155356 A1 | 6/2013 | Jang et al. | |
| 2013/0256669 A1 | 10/2013 | Jang et al. | |
| 2014/0347589 A1* | 11/2014 | Kim ................. | G02F 1/136286 349/43 |

\* cited by examiner

DISPLAY DEVICE

CLAIM OF PRIORITY

This application makes reference to, incorporates the same herein, and claims all benefits accruing under 35 U.S.C. § 119 from an application for DISPLAY DEVICE earlier filed in the Korean Intellectual Property Office on 1 Aug. 2014 and there duly assigned Serial No. 10-2014-0099175.

BACKGROUND OF THE INVENTION

Field of the Invention

Embodiments of the inventive concept relate to a display device capable of realizing high resolution and wide viewing angle.

Description of the Related Art

A liquid crystal display (LCD) is a type of flat panel displays (FPDs), which is the most widely used these days, and includes a liquid crystal layer interposed between two substrates having electrodes, so that liquid crystal molecules of the liquid crystal layer are rearranged upon applying voltage to the electrodes, thereby adjusting the amount of transmitted light.

A display device using an organic light emitting diode (OLED) does not require a backlight unit for light emission unlike a liquid crystal display and can be manufactured to have a thin film laminated structure, which in turn imparts flexibility, and thus it is drawing attention as not only a flat panel display but also a flexible panel display.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY OF THE INVENTION

Aspects of embodiments of the inventive concept are directed toward a display device capable of realizing high resolution and wide viewing angle.

According to an embodiment of the inventive concept, a display device includes a first substrate; a plurality of gate lines arranged in a row direction on the first substrate; a plurality of data lines arranged in a column direction intersecting the row direction; and a plurality of pixels formed in a plurality of pixel areas defined by the gate and data lines, the plurality of pixels comprising at least a first pixel and a second pixel repectively disposed in a first pixel area and a second pixel area that are immediately adjacent to each other. Each of the first and second pixels comprises a thin film transistor electrically connected to the gate and data lines, and a pixel electrode electrically connected to the thin film transistor. The data lines are disposed-apart by different distances from each other in the column direction. Each of the first and second pixel areas comprises a first edge portion adjacent to one of the gate lines and a second edge portion adjacent to another of the gate lines, a lengh of the first edge portion being greater than a lengh of the second edge portion. The thin film transistor is disposed at the first edge portion of the first and second pixel areas.

The data lines may include first and second coupling portions bent in different directions in the pixel area.

The first and second coupling portions may be linearly symmetric.

The thin film transistor may include a gate electrode connected to the gate line, a source electrode connected to the data line, and a drain electrode connected to the pixel electrode through a contact hole. The gate electrode may overlap at least part of the contact hole.

The pixel electrodes may have different widths in the pixel area.

The width may be proportional to the distance between the data lines.

The pixels may include a first pixel column connected to odd-numbered gate lines and a second pixel column connected to even-numbered gate lines.

The data line may include a first data line connected to pixels of odd-numbered rows of the first pixel column or the second pixel column, and a second data line connected to pixels of even-numbered rows of the first pixel column or the second pixel column.

The first data line may apply driving signals having different polarity from the second data line.

The data line may include a first data line connected to pixels of the first pixel column and a second data line connected to pixels of the second pixel column.

The first data line may apply driving signals having different polarity from the second data line.

The pixels of the first pixel column may include thin film transistors having different sizes in the odd-numbered rows and the even-numbered rows.

According to another embodiment of the inventive concept, a display device may include a second substrate facing the first substrate, a liquid crystal layer between the first and second substrates, and a common electrode disposed on the first substrate or the second substrate and overlapping the pixel electrode.

The common electrode may overlap the pixel electrode with an insulating layer interposed therebetween on the first substrate.

The common electrode may have a shape of a plate-like plane.

According to yet another embodiment of the inventive concept, a display device includes a light emission layer on the pixel electrode and a common electrode on the light emission layer.

The display device may further include at least one of a hole injection layer and a hole transport layer between the pixel electrode and the light emission layer.

The display device may further include at least one of an electron transport layer and an electron injection layer between the light emission layer and the common electrode.

According to embodiments of the inventive concept, a display device has an effect of improvement in aperture ratio and transmittance, and also achieves high resolution and wide viewing angle because a space between data lines, in which a thin film transistor is formed, is larger in a pixel area so that the thin film transistor is aligned with a contact hole.

The foregoing summary is illustrative only and is not intended to be in any way limiting the claims of the inventive concept. In addition to the illustrative aspects, embodiments, and features described above, further aspects, embodiments, and features will become apparent by reference to the drawings and the following detailed description.

DETAILED DESCRIPTION OF THE INVENTION

Figure 1:
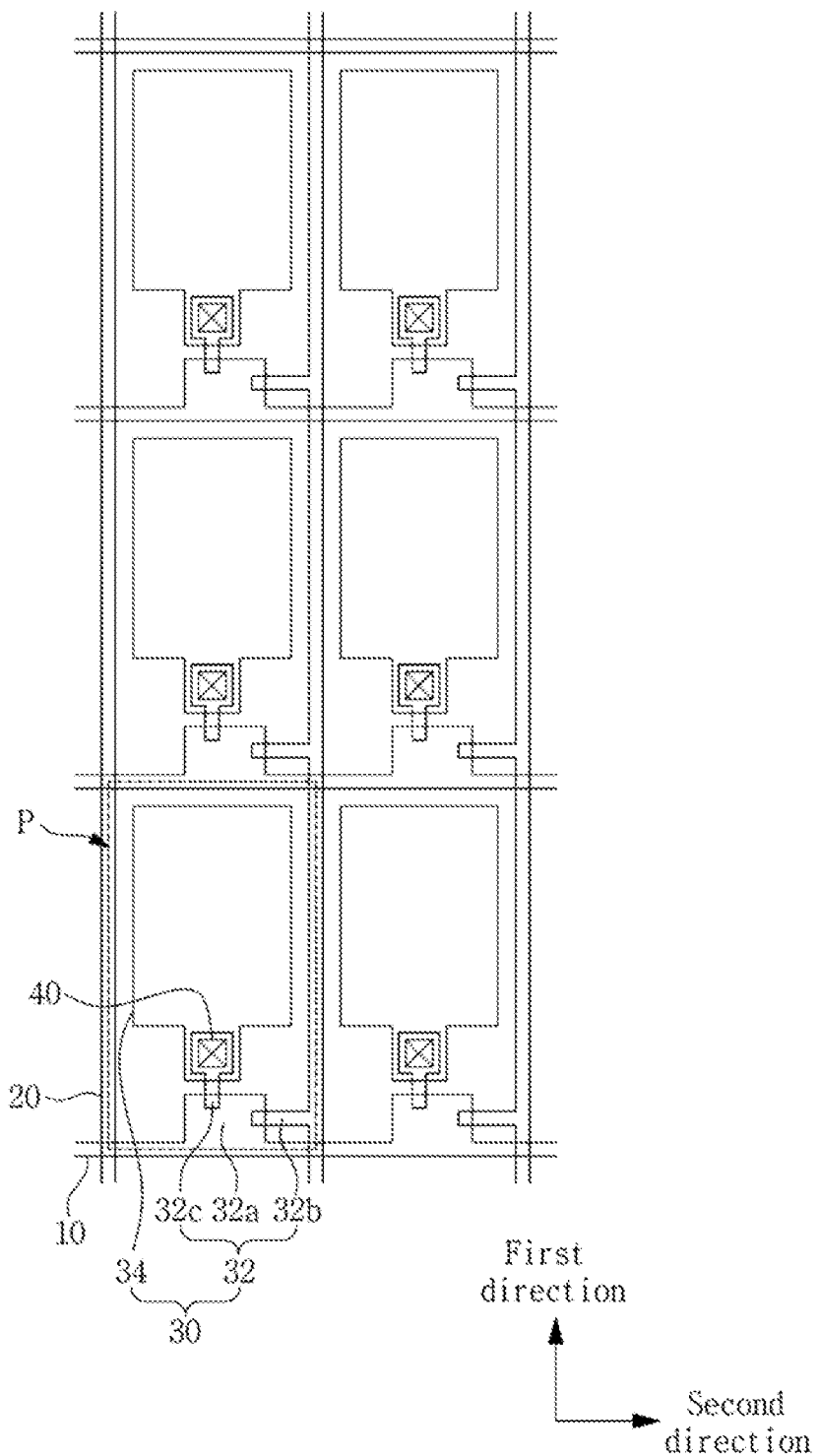
FIG. 1 is a plan view illustrating part of a display area of a contemporary liquid crystal display.

Advantages and features of structures formed in accordance with the present disclosure of invention and methods for achieving them will be made clear from embodiments described below in more detail with reference to the accompanying drawings. The present teachings may, however, be embodied in many different forms and should not be construed as being limited to the specific embodiments set forth herein. Rather, these embodiments are provided so that this disclosure will be thorough and complete, and will fully convey the scope of the present teachings to those skilled in the pertinent art. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular embodiments only and is not construed as limiting the invention. As used herein, the singular forms "a," "an" and "the" are intended to include the plural forms as well, unless the context clearly indicates otherwise. It will be further understood that the terms "comprises" and/or "comprising," when used in this specification, specify the presence of mentioned component, step, operation and/or element, but do not exclude the presence or addition of one or more other components, steps, operations and/or elements.

Unless otherwise defined, all terms used herein (including technical and scientific terms) have the same meaning as commonly understood by those skilled in the art to which this disclosure of invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

FIG. 1 is a plan view illustrating part of a display area of a contemporary liquid crystal display (LCD).

Referring to FIG. 1, the existing LCD may include a plurality of line-like gate lines 10 arranged in a first direction, a plurality of line-like data lines 20 arranged in a second direction intersecting (or crossing) the first direction, a pixel 30 in a pixel area P formed by adjacent gate lines 10 and adjacent data lines 20. A plurality of pixel areas P may be included in a display area. Each pixel 30 may include a pixel electrode 34 and at least one thin film transistor 32 formed in a same pixel area P. Each of line-like gate lines 10 extends along the second direction and each of the line-like data lines 20 extends along the first direction.

The thin film transistor (TFT) 32 of the pixel 30 may include a gate electrode 32a electrically connected to the gate line 10, a source electrode 32b electrically connected to the data line 20, and a drain electrode 32c electrically connected to the pixel electrode 34 through a contact opening (e.g., hole) 40.

Further, a common electrode (not shown) may be disposed on an entire surface of the display area including the plurality of pixel areas P. Voltage may be applied to the common electrode and the pixel electrode 34, thereby generating an electric field liquid that rearranges liquid crystal molecules of a liquid crystal layer.

However, in the contemporary LCD having the above-described configuration, the data lines 20 may be spaced a short distance apart in the pixel area P so as to realize high resolution such that the TFT 32 and the contact hole 40, which are disposed between the data lines 20, may not be aligned with each other, and thus aperture ratio and transmittance may be reduced.

Figure 2:
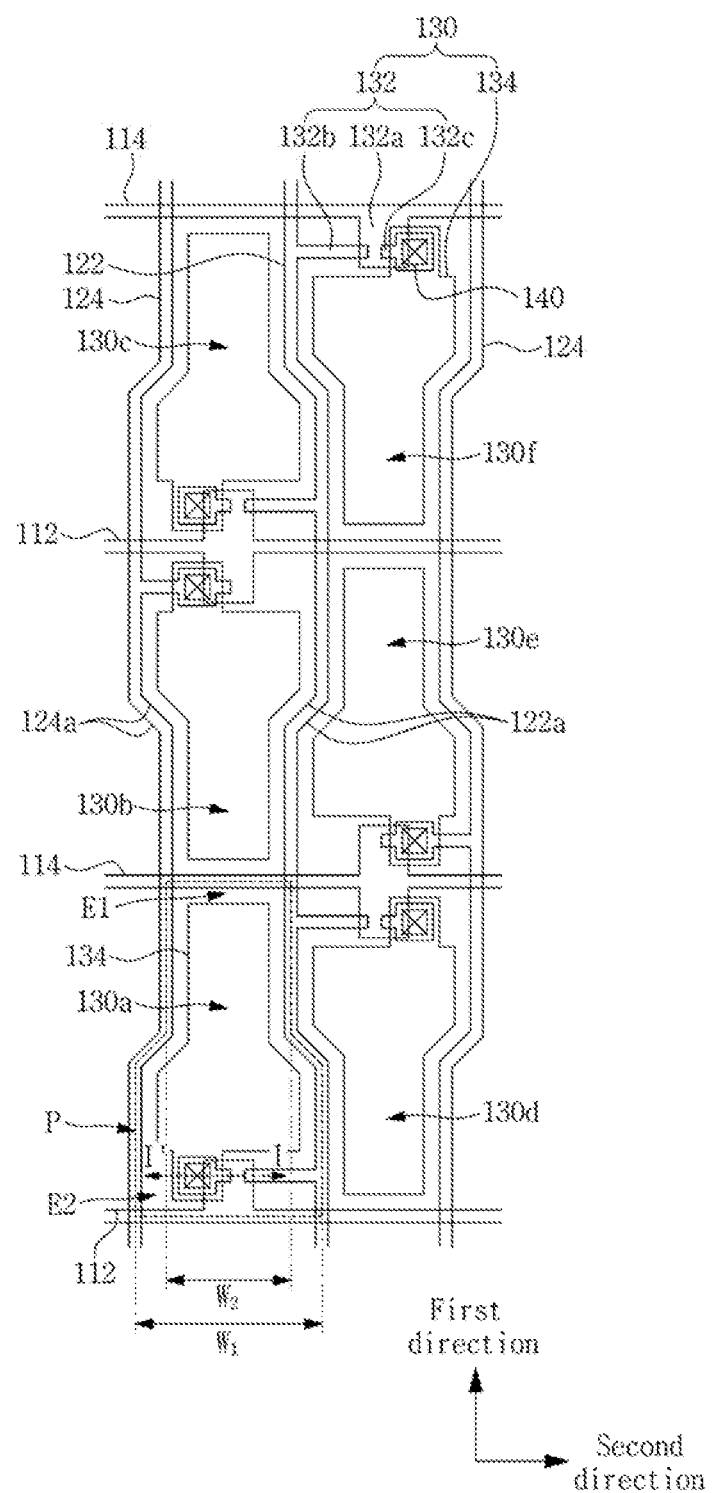
FIG. 2 is a plan view illustrating part of a display area of a display device according to an embodiment of the inventive concept.
Figure 3:
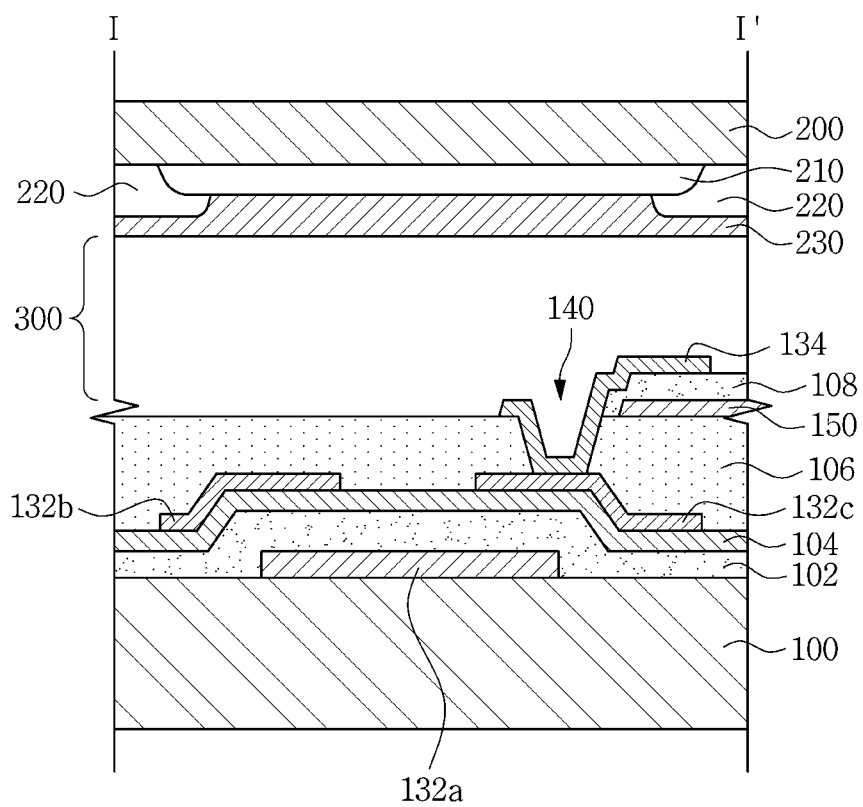
FIG. 3 is a cross-sectional view of the display device illustrated in FIG. 2, taken along line I-I' of FIG. 2.

Referring to FIG. 2 and FIG. 3, a display device according to an embodiment may include a first substrate 100, gate lines 112 and 114 alternately arranged in a first direction on the first substrate 100, data lines 122 and 124 alternately arranged in a second direction intersecting the first direction on the first substrate 100, and a pixel 130 formed in a pixel area P. The pixel area P may be defined as an area that is formed by connecting central portions of adjacent gate lines 112 and 114 to central portions of adjacent data lines 122 and 124, and thus a shape of the pixel area P may be determined by the gate lines 112 and 114 and the data lines 122 and 124.

Further, referring to FIG. 3, the display device illustrated in FIG. 2 may be a liquid crystal display (LCD) and may include first and second substrates 100 and 200 facing each other and may also include a liquid crystal layer 300 interposed therebetween.

The alternatively arranged gate line 112 and 114 may be spaced apart from each other in the first direction on the first substrate 100 made of transparent glass or plastic. The gate lines 112 and 114 may include an aluminum-based metal such as aluminum (Al) or aluminum alloy, a silver-based metal such as silver (Ag) or silver alloy, a copper-based metal such as copper (Cu) or copper alloy, a molybdenum-based metal such as molybdenum (Mo) or molybdenum alloy, chromium (Cr), tantalum (Ta), titanium (Ti), or the like, but embodiments of the inventive concept are not limited thereto. The gate line 112 and 114 may have a multilayer structure in a cross-sectional thickness direction in which two or more conductive layers having different physical properties are laminated.

The alternatively arranged data lines 122 and 124 may be spaced apart from each other in the second direction so as to form a plurality of pixel areas P. The data lines 122 and 124 may include refractory metals such as molybdenum (Mo), chromium (Cr), tantalum (Ta), and titanium (Ti) or alloys thereof, or may have a multilayer structure in a cross-sectional thickness direction, including a refractory metal layer and a low resistance conductive layer.

The data lines 122 and 124 may be spaced apart by different distances from each other in the pixel area P and may include first and second coupling portions 122a and 124a, which are bent in different directions in the pixel area P. The first and second coupling portions 122a and 124a may be desirably linearly symmetric. Therefore, the pixel area P may be shaped like a gourd or a trapezoid.

According to an embodiment, the first and second coupling portions 122a and 124a may be disposed at an angle that is not a right angle (90°) with respect to the gate lines 122 and 124, and the data line 122 may be spaced apart from the data line 124 by different distances from each other in the pixel area P by the first and second coupling portions 122a and 124a.

The pixel area P may have a first edge portion E1 adjacent to the gate line 112 and a second edge portion E2 adjacent to the gate line 114. The first edge portion E1 has a length of W1 and the second edge portion E2 has a length of W2, a length of W1 is greater than a length of W2.

At least one pixel 130 may be disposed in the pixel area P. Referring to FIG. 2, one pixel 130 may be disposed in one pixel area P, but embodiments of the inventive concept are not limited thereto. Two or more pixels 130 may be disposed in one pixel area P.

The pixels 130 may include a TFT 132 electrically connected to the one of the gate lines 112 and 114 and one of the data lines 122 and 124, and may also include a pixel electrode 134.

The TFT 132 may include a gate electrode 132a connected to one of the gate lines 112 and 114, a source electrode 132b connected to one of the data lines 122 and 124, and a drain electrode 132c connected to the pixel electrode 134 through a contact hole 140 formed in an insulating layer 106 disposed on the TFT 132. The gate electrode 132a, the source electrode 132b, and the drain electrode 132c may be insulated from each other by a gate insulating layer 102. A semiconductive layer 104 may be disposed between the source electrode 132b and the drain electrode 132c and the gate insulating layer 102.

The TFT 132 may be aligned with the contact hole 140, and for the alignment, it is desirable that the gate electrode 132a overlaps at least part of the contact hole 140.

In the TFT 132, when a gate voltage transmitted to the one of the gate lines 112 and 114 is applied to the gate electrode 132a, the semiconductive layer 104 may be activated, and a data voltage transmitted from one of the data lines 122 and 124 to the source electrode 132b may be applied to the drain electrode 132c by the activated semiconductive layer 104, and then the data voltage may be applied to the pixel electrdoe 134 through the contact hole 140.

The TFT 132 may be disposed in a region where a space between the data lines 122 and 124 is larger in the pixel area P. More specifically, the TFT 132 is disposed at the first edge portion E1. As shown in FIG. 2, each TFT 132 of at least two of the pixels 130 that are immediately adjacent to each other is disposed at the first edge portion E1 of the pixel areas P. Thus the TFT 132 may be aligned with the contact hole 140.

The pixel electrode 134 may have different widths in the pixel area P and the width of the pixel electrode 134 may be proportional to the space between the data lines 122 and 124.

Further, the pixel electrode 134 may have substantially the same shape as the pixel area P and may be shaped like a gourd or a trapezoid, but embodiments of the inventive concept are not limited thereto. The pixel electrode 134 may have various shapes that are different from that of the pixel area P.

The pixels 130 may include a first pixel column in which pixels 130a, 130b, and 130c connected to odd-numbered gate lines 112 are disposed in a first direction and a second pixel column in which pixels 130d, 130e, and 130f connected to even-numbered gate lines 114 are disposed in the first direction.

In this case, a first data line 122 is connected to the pixels 130a, 130c, 130d, and 130f of odd-numbered rows of the first pixel column or the second pixel column, and a second data line 124 is connected to the pixels 130b and 130e of even-numbered rows of the first pixel column or the second pixel column.

The first and second data lines 122 and 124 may apply driving signals having different polarities from each other, and thus the pixel 130 may be driven by a dot inversion method.

The common electrode 150 may be disposed to overlap the pixel electrode 134 with an insulating layer 108 interposed therebetween on the first substrate 100, but embodiments of the inventive concept are not limited thereto. The common electrode 150 may also be suitably disposed on the second substrate 200 so as to overlap the pixel electrode 134.

The common electrode 150 may be formed in the shape of a flat plate and for example, it may have a planar shape and be formed in the shape of a whole plate on the entire surface of the first substrate 100, or it may have an opening formed in a region corresponding to the circumference of the drain electrode 132c.

The second substrate 200 may be made of the same material as the first substrate 100.

A light-shielding member 210 may be disposed on the second substrate 200 to shield the TFT 132 and the contact hole 140, thereby reducing light leakage, or a color filter 220 may be disposed on the second substrate 200. The light-shielding member 210 and the color filter 220 may be all disposed on the first substrate 100.

A cover layer 230 may be disposed on the light-shielding member 210 and the color filter 220 to prevent the color filter 220 from being exposed and to provide a flat surface. The cover layer 230 may be made of an organic insulating material, but embodiments of the inventive concept are not limited thereto. The cover layer 230 may be omitted.

The display device illustrated in FIGS. 2 and 3 may be a liquid crystal display (LCD), but embodiments of the inventive concept are not limited thereto. According to an embodiment, the display device may be an organic light emitting diode (OLED) display.

Although not illustrated, the OLED display may further include a light emission layer (not shown) on a pixel electrode (not shown) and also include a common electrode (not shown) on the light emission layer (not shown).

The OLED display may also include at least one of a hole injection layer and a hole transport layer between the pixel electrode and the light emission layer.

The OLED display may also include at least one of an electron transport layer and an electron injection layer between the light emission layer and the common electrode.

The OLED display may further include a thin film encapsulation layer on the common electrode. The thin film encapsulation layer may include one or more inorganic layers and one or more organic layers and the inorganic and organic layers may be alternately laminated.

The inorganic layers may be made of one or more inorganic substances selected from $Al_2O_3$, $TiO_2$, $ZrO$, $SiO_2$, AlON, AlN, SiON, $Si_3N_4$, ZnO, and $Ta_2O_5$. The inorganic layers may be formed by utilizing a chemical vapor deposition (CVD) method or an atomic layer deposition (ALD)

method. However, embodiments of the inventive concept are not limited to these methods. The inorganic layers can be formed by using many different suitable methods which are known to those skilled in the art.

The organic layers may be made of a polymer material. Examples of the polymer material may include acrylic resin, epoxy resin, polyimide, polyethylene, and the like. The organic layers may be formed through a thermal deposition process. The thermal deposition process for forming the organic layers may be performed at a temperature at which the light emission layer is not likely to be damaged. However, embodiments of the inventive concept are not limited thereto, and the organic layers can be formed by utilizing many different suitable methods known to those skilled in the art.

Figure 4:
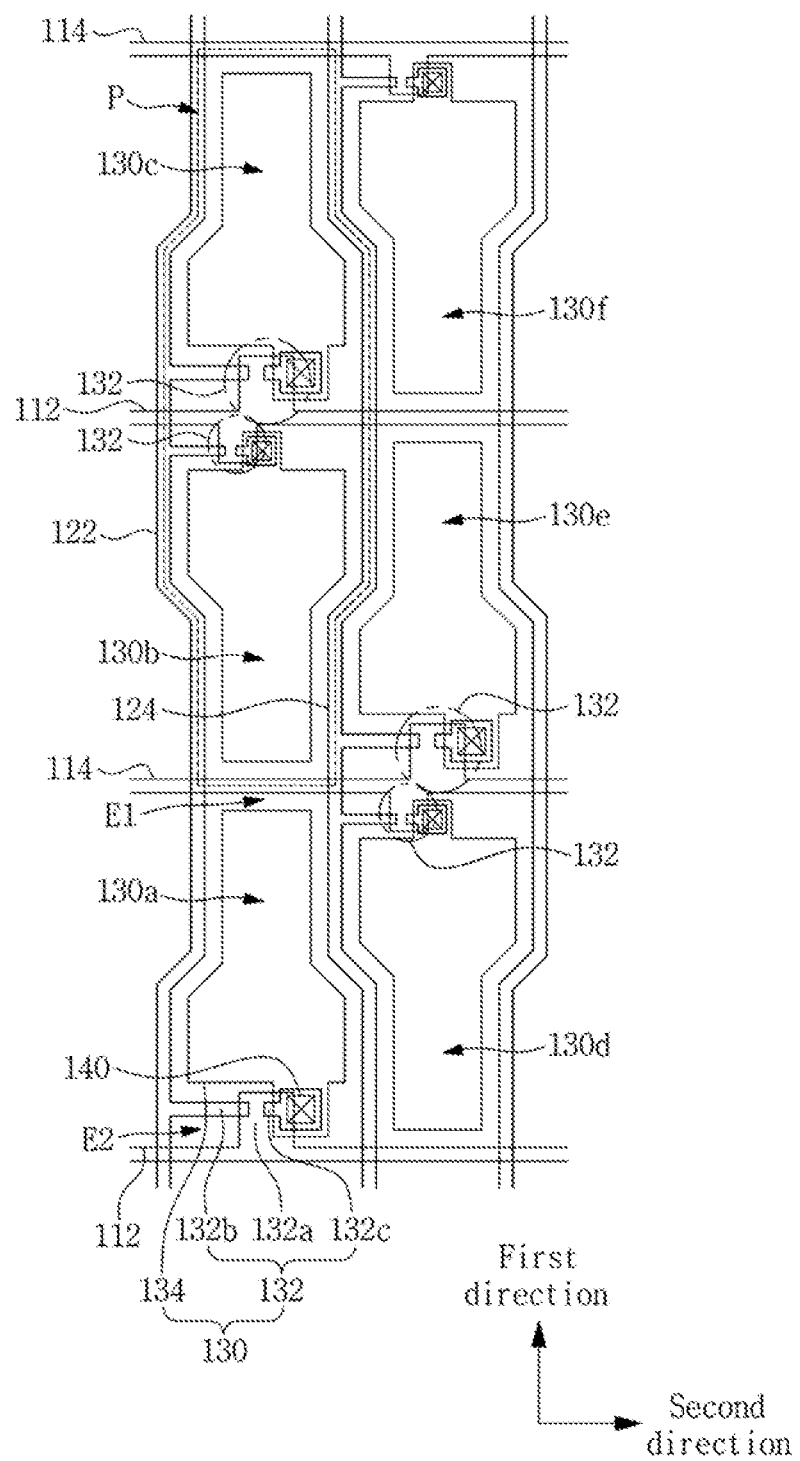
FIG. 4 is a plan view illustrating part of a display area of a display device according to another embodiment.

Referring to FIG. 4, a display device according to another embodiment may have configurations in which two pixels are disposed in one pixel area P and pixels of one pixel column are connected to one of data lines 122 and 124, compared to the display device illustrated in FIG. 2. The other configurations of the display device according to another embodiment may be consistent with those of the display device illustrated in FIG. 2, and thus descriptions of the same configurations will be omitted for brevity.

In the display device illustrated in FIG. 4, two pixels 130b and 130c may be disposed in one pixel area P and a TFT 132 included in one pixel 130b may be different in size from a TFT 132 included in the other pixel 130c. The gate electrodes of the TFTs 132 of the two pixels 130b and 130c are electrically connected to the same gate line 112, and the source electrodes of the TFTs 132 of the two pixels 130b and 130c are electrically connected to the same data line 122.

In other words, the pixels 130a, 130b, and 130c of the first pixel column may include the TFTs 132, which differ from each other in size, in odd-numbered rows and even-numbered rows.

A first data line 122 is connected to the pixels 130a, 130b, and 130c of the first pixel column and a second data line 124 is connected to the pixels 130d, 130e, and 130f of the second pixel column. The first and second data lines 122 and 124 may apply driving signals having different polarities from each other, and thus the pixel 130 may be driven by a line inversion method.

Relatively high voltage may be applied to the pixel electrode 134 connected to the large TFT 132 and relatively low voltage may be applied to the pixel electrode 134 connected to the small TFT 132, as the large TFT 132 has a relatively higher ratio of channel width to channel length than the small TFT 132. Thus, power consumption of a display device may be reduced and high resolution may be achieved.

Figure 5:
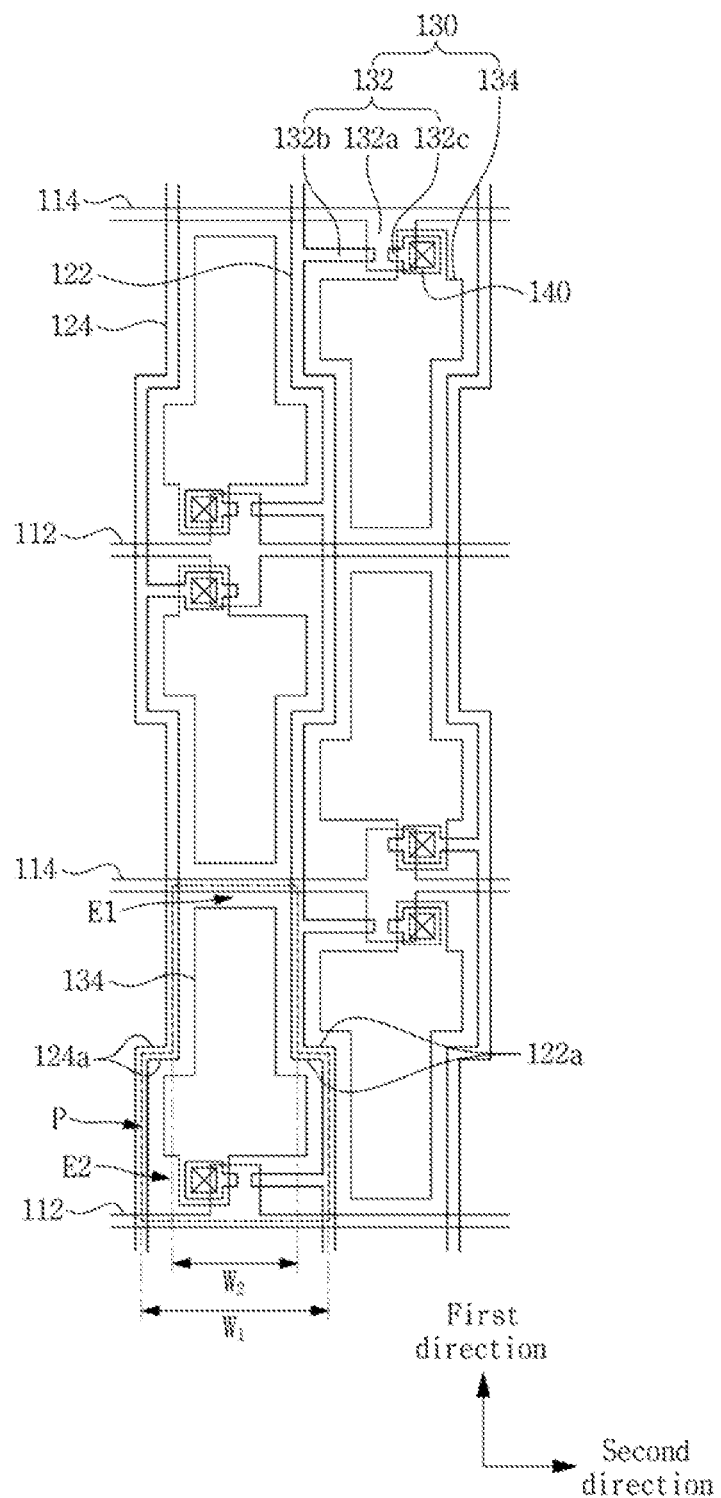
FIG. 5 is a plan view illustrating part of a display area of a display device according to yet another embodiment.

Referring to FIG. 5, a display device according to yet another embodiment may include first and second coupling portions 122a and 124a in the data lines 122 and 124, respectively, compared to the display device illustrated in FIG. 2. The other configurations of the display device illustrated in FIG. 5 may be consistent with those of the display device illustrated in FIG. 2, and thus descriptions of the same configurations will be omitted for brevity.

The first and second coupling portions 122a and 124a of the data lines 122 and 124 may be disposed parallel to the gate lines 112 and 114 so as to be linearly symmetric. The data line 122 may be spaced apart from the data line 124 by different distances in the pixel area P by the first and second coupling portions 122a and 124a.

Figure 6:
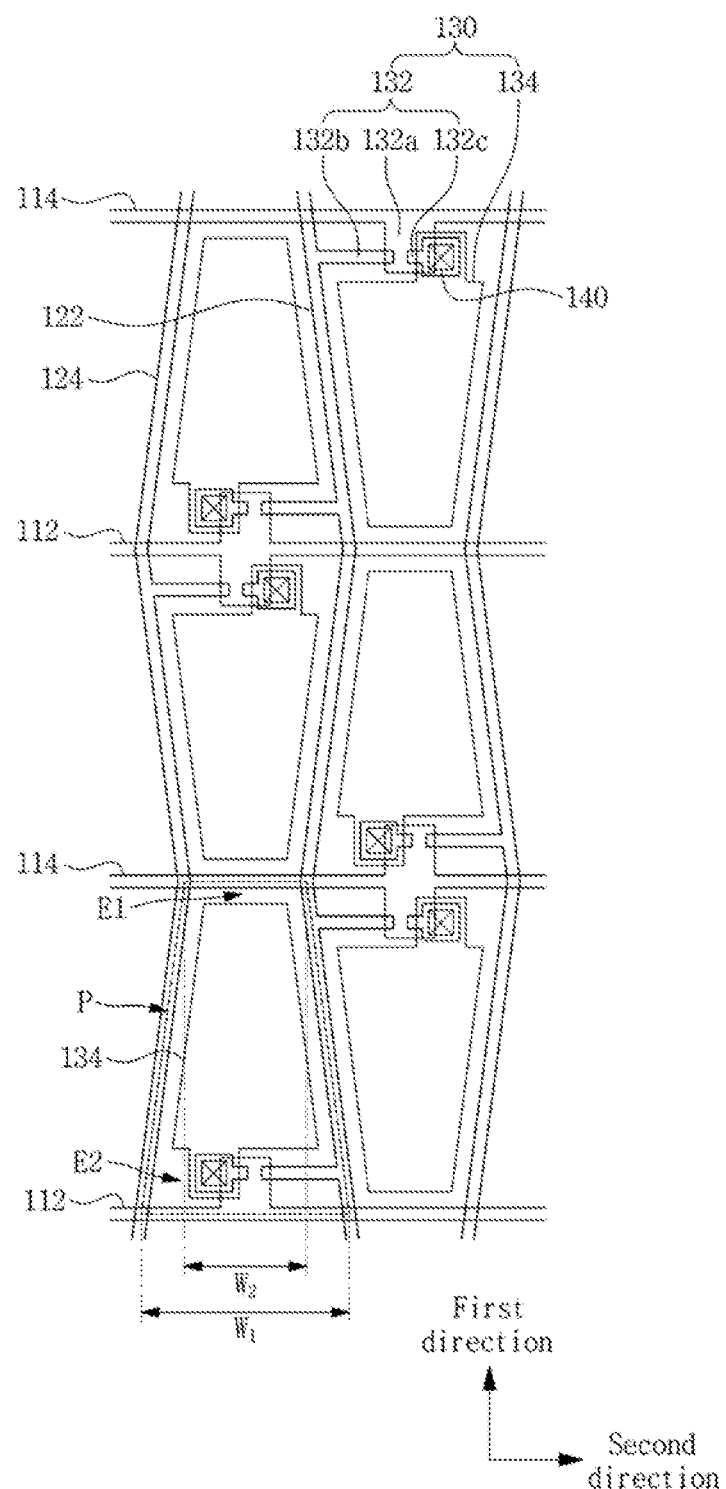
FIG. 6 is a plan view illustrating part of a display area of a display device according to yet another embodiment.

Referring to FIG. 6, a display device according to yet another embodiment may not include the first and second coupling portions 122a and 124a in the data lines 122 and 124, respectively, compared to the display device illustrated in FIG. 2. The other configurations of the display device illustrated in FIG. 6 may be consistent with those of the display device illustrated in FIG. 2, and thus descriptions of the same configurations will be omitted for brevity.

In the display device illustrated in FIG. 6, the portion of the data lines 122 forming a pixel area P may be inclined at a first predetermined angle with respect to the gate line forming the same pixel area P. The portion of the data line 124 forming the same pixel may be inclined at a second predetermined angle with respect to the same gate line forming the same pixel P. The first predetermined angle is an acute angle and the second predetermined angle is an obtuse angle, or the first predetermined angle is an obtuse angle and the second predetermined angle is an acute angle. The data lines 122 and 124 may be spaced apart by different distances from each other in the pixel area P.

From the foregoing, it will be appreciated that various embodiments of the inventive concept have been described herein for purposes of illustration, and that various modifications may be made without departing from the scope and spirit of the present disclosure. Accordingly, the various embodiments disclosed herein are not intended to limit the scope of the inventive concept, and the true scope and spirit of the inventive concept is indicated by the following claims, and equivalents thereof.

What is claimed is:

1. A display device comprising:
   a first substrate;
   a plurality of gate lines arranged in a first direction on the first substrate;
   a plurality of data lines arranged in a second direction intersecting the first direction; and
   a plurality of pixels disposed in a plurality of pixel areas defined by the gate lines and data lines, the plurality of pixels comprising at least a first pixel and a second pixel respectively disposed in a first pixel area and a second pixel area that are immediately adjacent to each other,
   wherein each of the first and second pixels comprises a thin film transistor electrically connected to a same one of gate lines and the data lines, and a pixel electrode electrically connected to the thin film transistor,
   wherein a gate electrode of each of the thin film transistors is connected to the one of the gate lines,
   wherein one of a source electrode and a drain electrode of each of the thin film transistors is connected to the one of the data lines,
   wherein the data lines are disposed-apart by different distances from each other in the second direction, and each of the first and second pixel areas comprises a first edge portion adjacent to one of the gate lines and a second edge portion adjacent to another of the gate lines, a length of the first edge portion being greater than a length of the second edge portion, and
   wherein the thin film transistor is disposed at the first edge portion of the first and second pixel areas.

2. The display device of claim 1, wherein the data lines comprise first and second coupling portions bent in different directions.

3. The display device of claim 2, wherein the first and second coupling portions are linearly symmetric.

4. The display device of claim 1, wherein the thin film transistor comprises a gate electrode connected to the gate line, a source electrode connected to the data line, and a drain electrode connected to the pixel electrode through a contact hole, and wherein the gate electrode overlaps at least part of the contact hole.

5. The display device of claim 1, wherein the pixel electrodes have different widths in the pixel area.

6. The display device of claim 5, wherein the width is proportional to the distance between the data lines.

7. The display device of claim 1, further comprising:
a second substrate facing the first substrate;
a liquid crystal layer between the first and second substrates; and
a common electrode on the first substrate or the second substrate, the common electrode overlapping the pixel electrode.

8. The display device of claim 7, wherein the common electrode overlaps the pixel electrode with an insulating layer interposed there between on the first substrate.

9. The display device of claim 8, wherein the common electrode has a shape of a plate-like plane.

10. The display device of claim 1, further comprising:
a light emission layer on the pixel electrode; and
a common electrode on the light emission layer.

11. The display device of claim 10, further comprising at least one of a hole injection layer and a hole transport layer between the pixel electrode and the light emission layer.

12. The display device of claim 10, further comprising at least one of an electron transport layer and an electron injection layer between the light emission layer and the common electrode.

13. A display device comprising:
a first substrate;
a plurality of gate lines arranged in a first direction on the first substrate;
a plurality of data lines arranged in a second direction intersecting the first direction; and
a plurality of pixels disposed in a plurality of pixel areas defined by the gate lines and data lines, the plurality of pixels comprising at least a first pixel and a second pixel respectively disposed in a first pixel area and a second pixel area that are immediately adjacent to each other,
wherein each of the first and second pixels comprises a thin film transistor electrically connected to the gate and data lines, and a pixel electrode electrically connected to the thin film transistor,
wherein the data lines are disposed-apart by different distances from each other in the second direction, and each of the first and second pixel areas comprises a first edge portion adjacent to one of the gate lines and a second edge portion adjacent to another of the gate lines, a length of the first edge portion being greater than a length of the second edge portion,
wherein the thin film transistor is disposed at the first edge portion of the first and second pixel areas,
wherein the pixels comprise a first pixel column connected to odd-numbered gate lines and a second pixel column connected to even-numbered gate lines,
wherein the data line comprises a first data line connected to pixels of the first pixel column and a second data line connected to pixels of the second pixel column, and
wherein the pixels of the first pixel column comprise thin film transistors having different sizes in the odd-numbered rows and the even-numbered rows.

* * * * *